US012675197B2

(12) United States Patent
Li et al.

(10) Patent No.: US 12,675,197 B2
(45) Date of Patent: Jul. 7, 2026

(54) DISPLAY PANEL AND DISPLAY DEVICE

(71) Applicant: HKC CORPORATION LIMITED,
Shenzhen (CN)

(72) Inventors: Yao Li, Shenzhen (CN); Haijiang Yuan, Shenzhen (CN)

(73) Assignee: HKC CORPORATION LIMITED,
Shenzhen (CN)

( * ) Notice: Subject to any disclaimer, the term of this patent is extended or adjusted under 35 U.S.C. 154(b) by 0 days.

(21) Appl. No.: 19/026,686

(22) Filed: Jan. 17, 2025

(65) Prior Publication Data

US 2025/0291444 A1     Sep. 18, 2025

(30) Foreign Application Priority Data

Mar. 15, 2024    (CN) ......................... 202410309705.5

(51) Int. Cl.
| | |
|---|---|
| *G06F 3/044* | (2006.01) |
| *G06F 3/041* | (2006.01) |
| *H10K 59/40* | (2023.01) |
| *H10K 59/80* | (2023.01) |
| *H10K 102/00* | (2023.01) |

(52) U.S. Cl.
CPC ........ *G06F 3/0443* (2019.05); *G06F 3/04164* (2019.05); *H10K 59/40* (2023.02); *H10K 59/873* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 11,803,263 B2 * | 10/2023 | Xia | ......................... H10K 59/38 |
| 2018/0033829 A1 | 2/2018 | Oh | |
| 2018/0342560 A1 | 11/2018 | Ma et al. | |
| 2019/0157356 A1 | 5/2019 | Li et al. | |

FOREIGN PATENT DOCUMENTS

| | | | | |
|---|---|---|---|---|
| CN | 106775062 A | 5/2017 | | |
| CN | 107122077 A * | 9/2017 | ............. | G06F 3/047 |
| CN | 109273490 A * | 1/2019 | ........... | H10K 59/131 |
| KR | 20160062368 A | 6/2016 | | |

* cited by examiner

*Primary Examiner* — Duane N Taylor, Jr.

(57) ABSTRACT

A display panel includes: a substrate, a light-emitting element layer, a pixel defining layer, an encapsulation layer, a touch electrode layer, a touch driving layer, and a plurality of touch connection lines. The light-emitting element layer is arranged on the substrate, and includes multiple light-emitting elements arranged in an array. The pixel defining layer is arranged on the substrate, and every two adjacent light-emitting elements are separated from each other by the pixel defining layer. The encapsulation layer is arranged on the light-emitting element layer and used to encapsulate the light-emitting element layer. The touch electrode layer is arranged in the encapsulation layer. The touch driving layer is arranged between the substrate and the light-emitting element layer. The multiple touch connection lines are arranged to pass through the encapsulation layer and the pixel defining layer, and are used to connect the touch electrode layer and the touch driving layer.

20 Claims, 3 Drawing Sheets

100

170  130

<u>100</u>

DISPLAY PANEL AND DISPLAY DEVICE

CROSS-REFERENCE TO RELATED APPLICATIONS

This application claims the priority and benefit of Chinese patent application number 2024103097055, titled "Display Panel and Display Device" and filed Mar. 15, 2024 with China National Intellectual Property Administration, the entire contents of which are incorporated herein by reference.

TECHNICAL FIELD

This application relates to the field of display technology, and more particularly relates to a display panel and a display device.

BACKGROUND

The description provided in this section is intended for the mere purpose of providing background information related to the present application but doesn't necessarily constitute prior art.

With the continuous development of OLED (Organic Light-Emitting Diode) display technology, OLED is increasingly used in displays such as smartphones, tablets, computers, and televisions. The touch function of a display panel may be implemented in resistive, capacitive, surface acoustic wave, infrared optical imaging, and electromagnetic induction methods. For the time being, the display industry is mature in the capacitive type. The capacitive type is divided into mutual capacitance and self capacitance depending on the capacitance detection signal. A self-capacitive touch screen uses the capacitance change of a single electrode to transmit charge, with one end connected to the ground and the other end connected to an excitation or a sampling circuit to realize the recognition of capacitance. A mutual capacitance capacitive screen uses two electrodes to transmit charge, where one end is connected to the excitation, and the other end is connected to the sampling circuit to realize the recognition of capacitance. The advantages of self-capacitance are simplicity and small amount of computation, while the disadvantages are single-point touch and slow speed. The advantages of mutual capacitance are real multi-point and fast speed, while the disadvantages are complexity, high power consumption, and high cost. In-cell touch technology mainly integrates the touch into the display panel, and the touch driving design architecture may be integrated into the panel driver IC. On-cell touch technology places the touch outside the display panel and uses an external driving circuit to drive it. Due to the difference in capacitor design, the self-capacitive type is mostly used in in-cell touch technology products, and the mutual-capacitive type is used in on-cell touch technology products.

Relatively speaking, the current in-cell touch technology has obvious advantages over the on-cell touch technology, such as reduced thickness, reduced cost, reduced weight, less power consumption, etc. However, how to dispose the touch electrodes in the in-cell touch technology to improve the touch accuracy without affecting the internal film layers of the display panel has become a technical problem that technicians in this field need to solve urgently.

SUMMARY

In view of the above, it is therefore one purpose of the present application to provide a display panel and a display device, which improves the touch accuracy without reducing the encapsulating strength by disposing the touch electrodes in the encapsulation layer.

The present application discloses a display panel. The display panel includes a substrate, a light-emitting element layer, a pixel defining layer, an encapsulation layer, a touch electrode layer, a touch driving layer, and a plurality of touch connection lines. The light-emitting element layer is arranged on the substrate, and includes a plurality of light-emitting elements arranged in an array. The pixel defining layer is arranged on the substrate, and every two adjacent light-emitting elements are separated from each other by the pixel defining layer. The encapsulation layer is arranged on the light-emitting element layer, and is used to encapsulate the light-emitting element layer. The touch electrode layer is arranged in the encapsulation layer. The touch driving layer is arranged between the substrate and the light-emitting element layer. The plurality of touch connection lines are arranged to pass through the encapsulation layer and the pixel defining layer, and are used to connect the touch electrode layer and the touch driving layer.

In some embodiments, the touch electrode layer is formed of a composite material of a carbon nanotube and an organic polymer.

In some embodiments, the encapsulation layer includes a first inorganic layer, an organic encapsulation layer, and a second inorganic layer. The first inorganic layer is arranged on the light-emitting element layer. The organic encapsulation layer is arranged on the first inorganic layer. The second inorganic layer is arranged on the organic encapsulation layer. The touch electrode layer is arranged between the first inorganic layer and the second inorganic layer.

In some embodiments, a first through hole is defined in the pixel defining layer. A third through hole is defined in the first inorganic layer corresponding to the first through hole. The respective touch connection line is disposed to pass through the first through hole and the third through hole, and is used to connect the touch driving layer and the touch electrode layer.

In some embodiments, the organic encapsulation layer includes a first organic layer and a second organic layer. The first organic layer is disposed on the first organic layer. The second organic layer is disposed on the first organic layer. The touch electrode layer is disposed between the first organic layer and the second organic layer.

In some embodiments, the thickness of the first organic layer is less than the thickness of the second organic layer. The thickness of the first organic layer is less than or equal to 10 μm and greater than or equal to 3 μm. The thickness of the organic encapsulation layer is less than or equal to 30 μm and greater than or equal to 10 μm.

In some embodiments, the light-emitting element includes a bottom electrode, a light-emitting layer, and a top electrode. The light-emitting layer is arranged between the bottom electrode and the top electrode. The top electrodes of adjacent light-emitting elements are electrically connected. The first inorganic layer is arranged on the top electrode. A first through hole is arranged in the pixel defining layer. A second through hole is arranged in the top electrode corresponding to the first through hole. A third through hole is arranged in the first inorganic layer corresponding to the second through hole. A fourth through hole is arranged in the first organic layer corresponding to the third through hole. The respective touch connection line is arranged to pass through the fourth through hole, the third through hole, the second through hole, and the first through hole, and is used to connect the touch driving layer and the touch electrode layer.

In some embodiments, the aperture of the third through hole is smaller than that of the second through hole. The first inorganic layer is filled in the second through hole. The third through hole extends into the second through hole and is connected to the first through hole. The touch connection line is isolated from the top electrode by the first inorganic layer. The portion of the touch connection line located in the first through hole and the second through hole is formed by a material of the bottom electrode or the top electrode, and the portion located in the third through hole and the fourth through hole is formed by a composite material of a carbon nanotube and an organic polymer.

In some embodiments, the touch electrode layer includes a plurality of touch electrodes. Each of the touch electrodes is arranged corresponding to a plurality of light-emitting elements. Each of the touch electrodes is connected to the touch driving layer via at least two of the touch connection lines.

The present application further discloses a display device, including a driving circuit and the above-mentioned display panel. The driving circuit drives the display panel to display.

In this application, by disposing the touch electrode layer in the encapsulation layer, on the one hand, the insulation property and thickness of the encapsulation layer are used to prevent the touch electrode layer from affecting the light-emitting element, and meanwhile reduce the interference of the cathode of the light-emitting element on the touch signal. That is, the encapsulation layer is used to insulate and block the touch electrode layer. On the other hand, by disposing the touch electrode layer is disposed inside the encapsulation layer, without affecting the encapsulating effect of the encapsulation layer, the touch connection line is used to penetrate the encapsulation layer and the pixel defining layer, so that the touch driving layer and the touch electrode layer can be connected by the touch connection line. Thus, the driving wiring problem of the touch electrode layer in the encapsulation layer is solved by means of via holes, and so the impact on the encapsulation layer is relatively small. Furthermore, it is realized that the touch driving layer is disposed on the substrate, so that there is no need to set an external touch driving circuit for the touch electrode layer, thereby improving the touch accuracy without reducing the encapsulating strength, and improving the quality of the display panel.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principles of the present application in conjunction with the text description. Apparently, the drawings in the following description merely represent some embodiments of the present disclosure, and for those having ordinary skill in the art, other drawings may also be obtained based on these drawings without investing creative. In the drawings.

Figure 1:
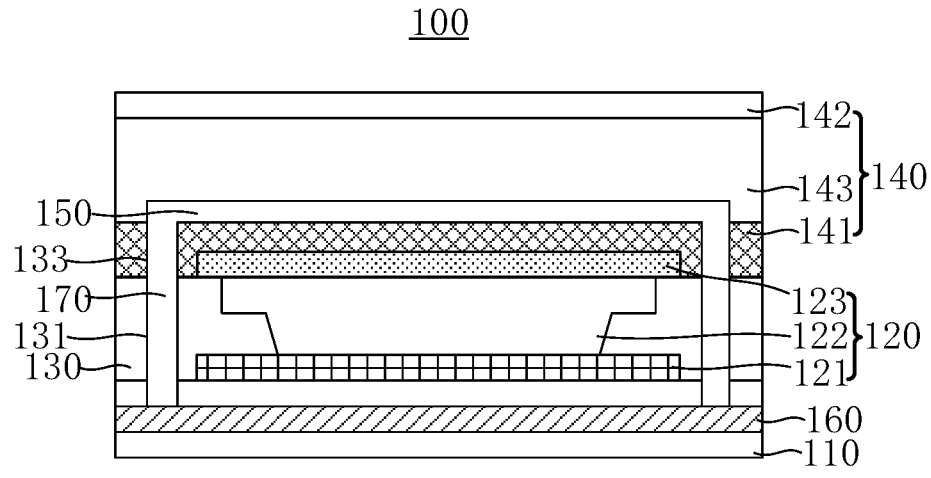
FIG. 1 is a schematic diagram of a display panel according to a first embodiment of the present application.

In the drawings: 100, display panel; 110, substrate; 120, light-emitting element; 121, bottom electrode; 122, light-emitting layer; 123, top electrode; 130, pixel defining layer; 131, first through hole; 132, second through hole; 133, third through hole; 134, fourth through hole; 140, encapsulation layer; 141, first inorganic layer; 142, second inorganic layer; 143, organic encapsulation layer; 144, first organic layer; 145, second organic layer; 150, touch electrode layer; 151, touch electrode; 160, touch driving layer; 170, touch connection line; 200, display device; 210, driving circuit.

DETAILED DESCRIPTION OF EMBODIMENTS

It should be understood that the terms used herein, the specific structures and functional details disclosed therein are merely representative for describing some specific embodiments, but the present application can be implemented in many alternative forms and should not be construed as being limited to only these embodiments described herein.

As used herein, terms "first", "second", or the like are merely used for illustrative purposes, and shall not be construed as indicating relative importance or implicitly indicating the number of technical features specified. Thus, unless otherwise specified, the features defined by "first" and "second" may explicitly or implicitly include one or more of such features. Terms "multiple", "a plurality of", and the like mean two or more. In addition, terms "up", "down", "left", "right", "vertical", and "horizontal", or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure. For those of ordinary skill in the art, the specific meanings of the above terms as used in the present application can be understood depending on specific contexts.

The present application will be described in detail below with reference to the accompanying drawings and some optional embodiments.

FIG. 1 is a schematic diagram of a display panel according to a first embodiment of the present application. As illustrated in FIG. 1, the present application discloses a display panel 100. The display panel 100 includes a substrate 110, a light-emitting element layer 12, a pixel defining layer 130, an encapsulation layer 140, a touch electrode layer 150, a touch driving layer 160, and a plurality of touch connection lines 170. The light-emitting element layer 12 is arranged on the substrate 110, including a plurality of light-emitting elements 120 arranged in an array. The pixel defining layer 130 is arranged on the substrate 110. Two adjacent light-emitting elements 120 are separated from each other by the pixel defining layer 130. The encapsulation layer 140 is arranged on the light-emitting element layer for encapsulating the light-emitting element layer 12. The touch electrode layer 150 is arranged in the encapsulation layer 140. The touch driving layer 160 is arranged between the substrate 110 and the light-emitting element layer 12. The plurality of touch connection lines 170 are arranged in the encapsulation layer 140 and the pixel defining layer 130 to connect the touch electrode layer 150 with the touch driving layer 160.

In this application, by disposing the touch electrode layer 150 in the encapsulation layer 140, on the one hand, the insulation property and thickness of the encapsulation layer 140 are used to prevent the touch electrode layer 150 from affecting the light-emitting element 120, and at the same time reduce the interference of the cathode of the light-emitting element 120 on the touch signal. That is, the encapsulation layer 140 is used to insulate and block the touch electrode layer 150. On the other hand, by disposing the touch electrode layer 150 is disposed inside the encapsulation layer 140, without affecting the encapsulating effect of the encapsulation layer 140, the touch connection line 170 is used to penetrate the encapsulation layer 140 and the pixel defining layer 130, so that the touch driving layer 160 and the touch electrode layer 150 can be connected by the touch connection line 170. Thus, the driving wiring problem of the touch electrode layer 150 in the encapsulation layer 140 is solved by means of via holes, and so the impact on the encapsulation layer 140 is relatively small. Furthermore, it is realized that the touch driving layer 160 is disposed on the substrate 110, so that there is no need to set an external touch driving circuit for the touch electrode layer 150, thereby improving the touch accuracy without reducing the encapsulating strength, and improving the quality of the display panel 100.

This embodiment of the present application is an application of embedded touch or in-cell technology. For the display panel 100, the in-cell touch technology refers to embed the touch function into the display panel 100. A transparent conductive layer (ITO) may be used as the touch electrode layer 150, so that the display panel 100 has touch capability. Since the touch driving layer 160 can be formed on the substrate of the display panel 100, compared with the on-cell touch technology, no external touch driving circuit is required, and no touch electrode layer 150 is required to be disposed outside the panel, thereby realizing the effect of reducing thickness. For OLED display panel 100, only on-cell touch technology can be used. That is, a touch electrode layer 150 is formed by using a transparent conductive layer and is disposed on below a protective cover plate or a protective layer on encapsulation layer 140. If in-cell touch technology is to be implemented, since it is set disposed the encapsulation layer 140, an independent driving circuit is required for driving purposes. For the self-capacitive touch solution, it is needed to transmit the touch signal or collect the sampling signal through the touch driving layer 160 to realize the recognition of the capacitance change of the touch electrode layer 150. Therefore, the touch driving layer 160 is indispensable. The in-cell touch technology mentioned in this embodiment of the present application refers to disposing the touch driving layer 160 of the touch electrode layer 150 on the substrate 110 of the display panel 100, and integrating the driving circuit of the touch function into the display panel 100 by means of the touch connection line 170.

In a specific embodiment, the encapsulation layer 140 includes a first in-organic layer 141, an organic encapsulation layer 143, and a second inorganic layer 142. The first inorganic layer 141 is disposed on the light-emitting element layer. The organic encapsulation layer 143 is disposed on the first inorganic layer 141. The second inorganic layer 142 is disposed on the organic en-capsulation layer 143. The touch electrode layer 150 is disposed between the first inorganic layer 141 and the second inorganic layer 142.

The light-emitting element 120 includes a bottom electrode 121, a light-emitting layer 122, and a top electrode 123. The bottom electrode 121 is disposed on the substrate 110. The light-emitting layer 122 is disposed between the bottom electrode 121 and the top electrode 123. The first inorganic layer 141 is disposed on the top electrode 123. The top electrode 123 may be a cathode. The bottom electrode 121 may be an anode. The anode may be formed of a metal material. The cathodes of the adjacent light-emitting elements 120 are electrically connected.

For the OLED display panel 100, the encapsulation layer 140 may adopt an encapsulation of inorganic materials and organic materials that are stacked one over another. In this solution, the touch electrode layer 150 is disposed between the first inorganic layer 141 and the second inorganic layer 142, and the first inorganic layer 141 is used to isolate the touch electrode layer 150 from the cathode of the light-emitting element 120, thereby preventing the touch signal of the touch electrode layer 150 from being interfered by the signal of the cathode.

Specifically, the pixel defining layer 130 includes a first through hole 131. The first inorganic layer 141 includes a third through hole 133 corresponding to the first through hole 131. The touch connection line 170 is disposed to pass through the first through hole 131 and the third through hole 133, and is used to connect the touch driving layer 160 with the touch electrode layer 150.

In this embodiment, through holes can be formed in the pixel defining layer 130 and the first inorganic layer 141 by laser drilling or photolithography drilling, and the touch connection line 170 is disposed through the first through hole 131 and the third through hole 133 to connect the touch electrode layer 150 with the touch driving layer 160. In the photolithography drilling method, the touch connection line 170 may be formed using the same material as the bottom electrode 121 or the top electrode 123. For example, in the first through hole 131 of the pixel defining layer 130, the first through hole 131 may be formed in the pixel defining layer 130 before the bottom electrode 121 is formed. In the manufacturing process of the bottom electrode 121, the first through hole 131 may be filled with a wiring of the material of the bottom electrode 121, where the wiring is directly connected to the touch driving layer 160 through the first through hole 131.

It can be understood that a pixel driving layer is also included between the substrate 110 and the light-emitting element layer in the embodiments of the present application. The pixel driving layer is used to drive the plurality of light-emitting elements 120 to emit light. In one embodiment, the pixel driving layer and the touch driving layer 160 may be arranged in the same layer. A plurality of metal layers and insulating layers are stacked to form the pixel driving layer and the touch driving layer 160. The touch driving layer 160 and the bottom electrode 121 may be insulated from each other by an insulating layer.

Of course, in this embodiment, the touch electrode layer 150 may be located above or below the organic encapsulation layer 143, and the specific selection can be made depending on the actual situation. Two points are mainly considered. One is that when the thickness of the first inorganic layer 141 is relatively small, the touch electrode layer 150 is easily disturbed by the cathode. In this regard, the organic encapsulation layer 143 may be set below the touch electrode layer 150. Secondly, the touch electrode layer 150 needs to pass through multiple film layers to connect with the touch driving layer 160 through the touch connection line 170. When the thickness of the film layers between the touch electrode layer 150 and the touch driving layer 160 is thicker, the length of the touch connection line 170 used will be longer, and the hole dug will be deeper, resulting in increased processing difficulty. In this case, the touch electrode layer 150 may be disposed between the organic encapsulation layer 143 and the first inorganic layer 141. Of course, in another embodiment, the thickness of the first inorganic layer 141 may be increased to improve the insulation effect between the touch electrode layer 150 and the top electrode 123 of the light-emitting element 120.

In one embodiment, if the touch electrode layer 150 is formed of a transparent conductive layer (ITO) material, due to the material problem of the transparent conductive layer, there may be a situation where the chemical properties are unstable thus leading to a decrease in the interface strength between the organic encapsulation layer 143, so that the encapsulation strength of the encapsulation layer 140 is easily reduced when the touch electrode layer 150 is formed in the encapsulation layer 140.

Based on the above, the touch electrode layer 150 in the embodiments of the present application is formed by a composite material of a carbon nanotubes and an organic polymer. The structure of carbon nanotubes (CNTs) is identical as the lamellar structure of graphite, and has good electrical conductivity. Furthermore, the resistance of carbon nanotubes is not limited by the length and diameter, which can minimize the problem of uneven impedance caused by wiring. Electrons do not generate heat when passing through carbon nanotubes. The transmission of electrons in carbon nanotubes is just like the transmission of light signals in optical fiber cables, with little energy loss, so it has high conductivity. Carbon nanotubes have stable chemical properties and are resistant to acid and alkali. Carbon nanotubes have a structure similar to that of polymers and can be combined with organic polymers to form high-performance composite materials. Therefore, a highly conductive composite material can be prepared by combining carbon nanotubes and organic polymers. The chemical properties of the composite material are similar to those of organic polymers, with surface inertness and relatively great elasticity, and a light transmittance of at least 85%.

In this solution, since the composite material is chemically inert and has relatively stable chemical properties, the encapsulating strength will not be reduced. Furthermore, since the composite material uses an organic polymer as a substrate, the interface strength between the touch electrode layer 150 and the organic encapsulation layer 143 is relatively large, and there will be no relatively large interface defects. Specifically, the thickness of the touch electrode layer 150 is about 1000 angstroms to 1500 angstroms.

The touch electrode layer 150 of the present application includes a plurality of touch electrodes 151. The plurality of touch electrodes 151 are each connected to the touch driving layer 160 through correspondingly connected touch connection lines 170. The touch driving layer 160 includes a plurality of touch driving lines, which are respectively connected to the plurality of touch electrodes 151 to realize the touch function.

Figure 2:
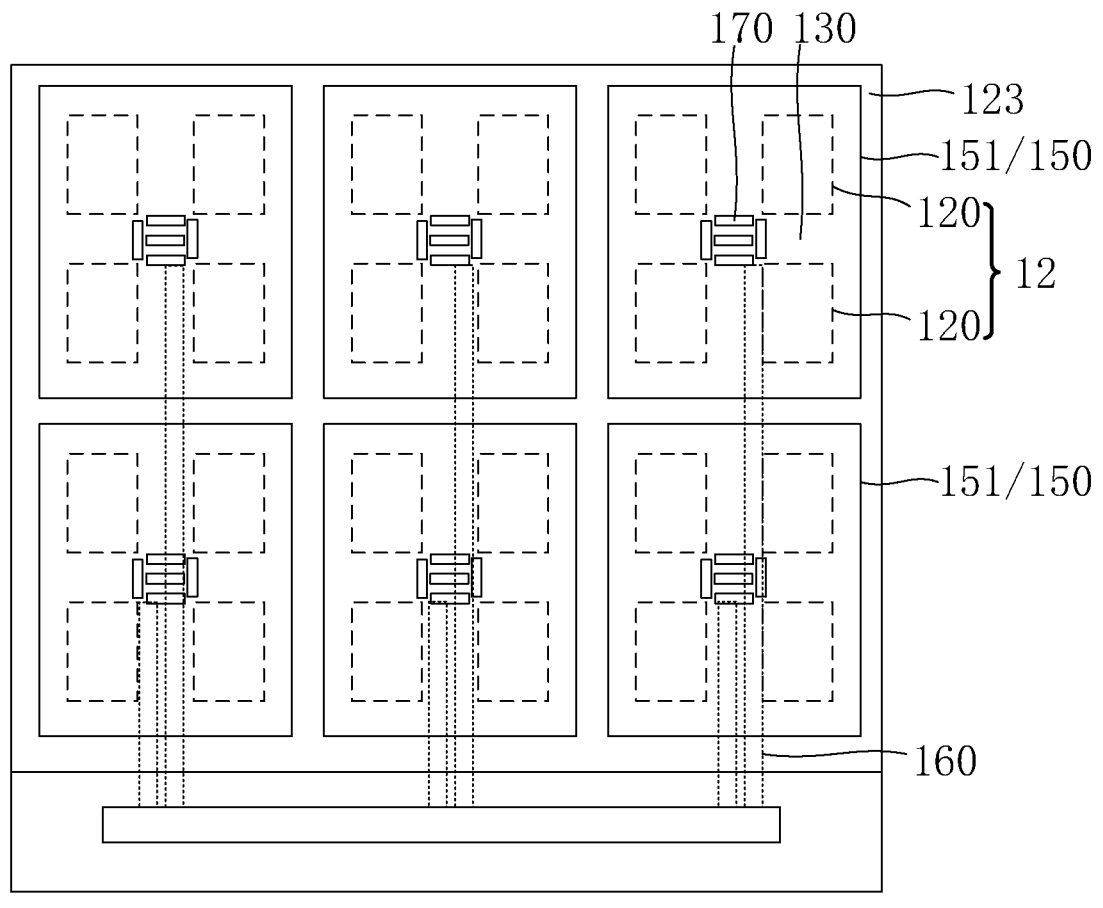
FIG. 2 is a schematic top view of a touch electrode according to the first embodiment of the present application.

FIG. 2 is a schematic top view of a touch electrode according to the first embodiment of the present application. As illustrated in FIG. 2, the touch electrode layer 150 includes a plurality of touch electrodes 151. The touch electrodes 151 are not electrically connected to each other. Each touch electrode 151 is connected to the touch driving layer 160 via at least two touch connection lines 170. That is, each touch electrode 151 is connected to a plurality of touch connection lines 170, and the plurality of touch connection lines 170 are correspondingly connected to the same touch driving line.

The plurality of light-emitting elements 120 include a plurality of red light-emitting elements 120, a plurality of green light-emitting elements 120, and a plurality of blue light-emitting elements 120. Every three light-emitting elements including the red light-emitting element 120, the green light-emitting element 120, and the blue light-emitting element 120 that are adjacent to each other constitute one pixel. Each touch electrode 151 is disposed to cover at least one pixel. That is, each touch electrode 151 is disposed to cover at least three light-emitting elements 120.

In this embodiment, when the area of the touch electrode 151 is larger, the number of corresponding touch connection lines 170 is larger. When one touch electrode 151 covers four light-emitting elements 120, then at least five touch connection lines 170 may be configured. That is, within the projection range of a touch electrode 151, at least five first through holes 131 and five second through holes 132 are defined to dispose the touch connection lines 170. The touch connection lines 170 may be disposed on the pixel defining layer 130 between adjacent light-emitting elements 120, or in the middle of four light-emitting elements 120, which is not limited herein.

In this embodiment, the touch electrode 151 formed of a composite material of carbon nanotubes and organic polymers is arranged between the first inorganic layer 141 and the second inorganic layer 142. The touch connection line 170 is arranged by using the first through hole 131 and the third through hole 133, so that the touch electrode 151 is connected to the touch driving layer 160 through the touch connection line 170. When the touch driving line in the touch driving layer 160 outputs an excitation signal, the capacitance formed between the touch electrode layer 150 and the cathode layer is recognized according to the sampling circuit. When the capacitance of a corresponding area changes in a preset manner, it is determined to be a touch operation, so that the next operation is performed accordingly. The advantage of this embodiment is that the touch accuracy of the display panel 100 is improved without affecting the encapsulating effect of the encapsulation layer 140.

Figure 3:
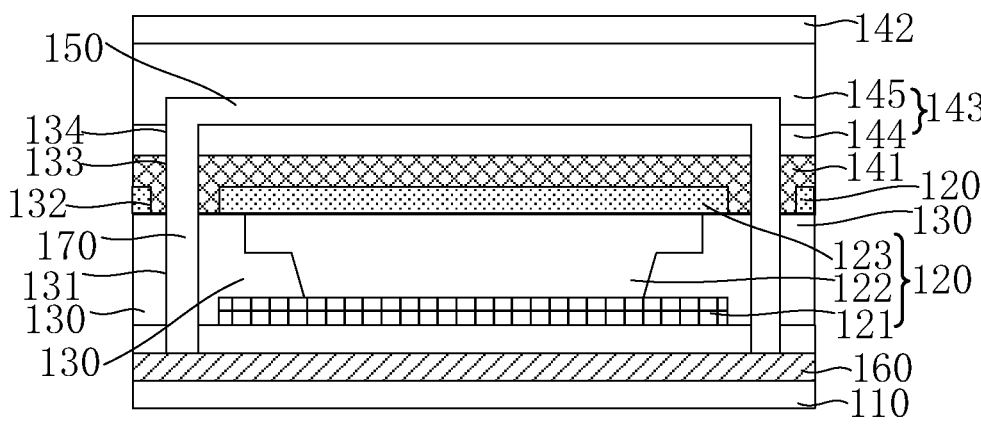
FIG. 3 is a schematic diagram of a first display panel according to a second embodiment of the present application.

FIG. 3 is a schematic diagram of a first display panel according to the second embodiment of the present application. As illustrated in FIG. 3, the present application discloses a display panel 100. The display panel 100 includes a substrate 110, a light-emitting element layer, a pixel defining layer 130, an encapsulation layer 140, a touch electrode layer 150, a touch driving layer 160, and a plurality of touch connection lines 170. The light-emitting element layer is arranged on the substrate 110, including a plurality of light-emitting elements 120 arranged in an array. The pixel defining layer 130 is arranged on the substrate 110, and every two adjacent light-emitting elements 120 are separated from each other by the pixel defining layer 130. The encapsulation layer 140 is arranged on the light-emitting element layer, and is used to encapsulate the light-emitting element layer. The touch electrode layer 150 is arranged in the encapsulation layer 140. The touch driving layer 160 is arranged between the substrate 110 and the light-emitting element layer. The plurality of touch connection lines 170 are arranged to pass through the encapsulation layer 140 and the pixel defining layer 130, and are used to connect the touch electrode layer 150 and the touch driving layer 160.

The encapsulation layer 140 includes a first inorganic layer 141, a first organic layer 144, a second organic layer 145, and a second inorganic layer 142. The first inorganic layer 141 is arranged on the light-emitting element layer. Specifically, the first inorganic layer 141 is arranged on the top electrode 123. The first organic layer 144 is disposed on the first inorganic layer 141. The second organic layer 145 is disposed on the first organic layer 144. The second inorganic layer 142 is disposed on the second organic layer 145. The touch electrode layer 150 is disposed between the first organic layer 144 and the second organic layer 145, and the material of the touch electrode layer 150 is formed of a composite material of carbon nanotubes and organic polymers.

Different from the previous embodiment, in this embodiment, the touch electrode layer 150 is arranged in the organic encapsulation layer 143, and the organic encapsulation layer 143 is divided into a second organic layer 145 arranged on the touch electrode layer 150 and a first organic layer 144 arranged under the touch electrode layer 150. In this embodiment, considering that the thickness of the first inorganic layer 141 may not be able to be increased, and the touch electrode layer 150 is formed of a composite material of an organic polymer, relatively speaking, when both sides of the touch electrode layer 150 are organic encapsulation layers 143, the touch electrode layer 150 has the least impact on the overall encapsulating effect of the encapsulation layer 140.

Specifically, the thickness of the touch electrode layer 150 is about 1000 angstroms to 1500 angstroms. The thickness of the first organic layer 144 is less than the thickness of the second organic layer 145. The thickness of the organic encapsulation layer 143 below the touch electrode layer 150 should be greater than or equal to 3 μm to ensure that the touch signal will not be interfered by the cathode. Meanwhile, since it is needed to drill downwards and connect with the touch driving layer 160 on the substrate 110, when its thickness is large, it will affect the accuracy of the drilling process and increase the difficulty of drilling. Therefore, the thickness of the organic encapsulation layer 143 is less than or equal to 30 μm and greater than or equal to 10 μm, and the thickness of the first organic layer 144 is less than or equal to 10 μm and greater than or equal to 3 μm.

Specifically, a first through hole 131 is defined in the pixel defining layer 130. A second through hole 132 is defined in the top electrode 123 corresponding to the first through hole 131. A third through hole 133 is defined in the first inorganic layer 141 corresponding to the second through hole 132. A fourth through hole 134 is defined in the first organic layer 144 corresponding to the third through hole 133. The touch connection line 170 is disposed to pass through the fourth through hole 134, the third through hole 133, the second through hole 132 and the first through hole 131, and is used to connect the touch driving layer 160 and the touch electrode layer 150.

In this solution, the touch connection line 170 needs to pass through the first organic layer 144, the first inorganic layer 141, the top electrode 123, the pixel defining layer 130 from the touch electrode layer 150 in sequence and then connect to the touch driving layer 160. For the top electrode 123, i.e., the cathode, it is required to perform insulation treatment between the top electrode 123 and the touch connection line 170. This can be achieved by filling the first inorganic layer 141 in the second through hole 132 and extending the third through hole 133 of the first inorganic layer 141 into the second through hole 132. Relatively speaking, the aperture of the third through hole 133 needs to be smaller than the aperture of the second through hole 132.

Specifically, the aperture of the third through hole 133 is smaller than the aperture of the second through hole 132. The first inorganic layer 141 is filled in the second through hole 132. The third through hole 133 extends into the second through hole 132 and is connected to the first through hole 131. The touch connection line 170 is isolated from the top electrode 123 by the first inorganic layer 141.

In one embodiment, the touch connection lines 170 are all made of a composite material of carbon nanotubes and organic polymers. In this embodiment, the composite material has a high conductivity and can be used for signal transmission, which can reduce the signal loss due to the multi-layer connection of the touch connection line 170. However, the drilling cost and process requirements are relatively higher, and laser drilling is required after the manufacturing process of each film layer is completed. After the drilling is completed, the touch electrode layer 150 and the touch connection line 170 are formed, and then the manufacturing process of the second organic layer 145 and other subsequent processes are performed.

Figure 4:
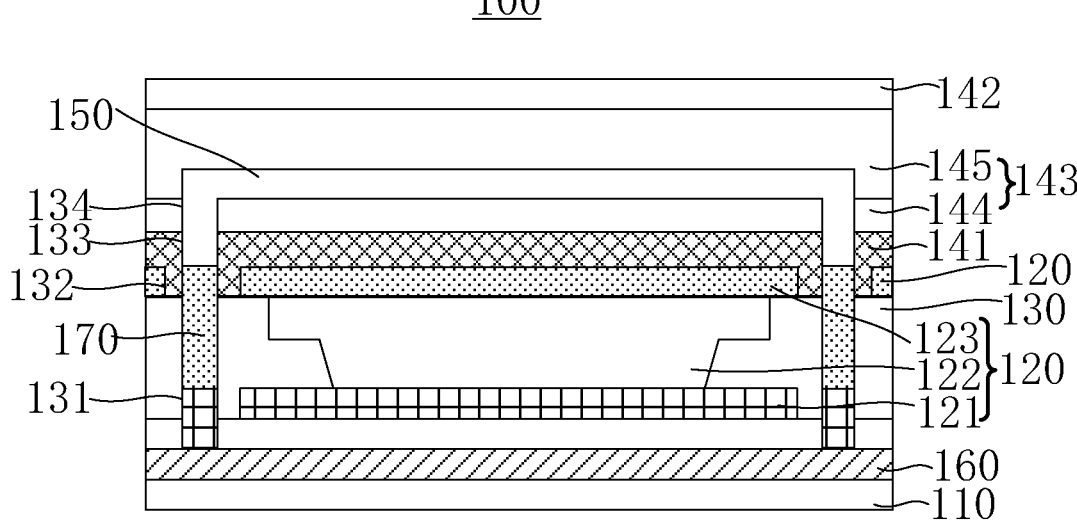
FIG. 4 is a schematic diagram of a second display panel according to the second embodiment of the present application.

FIG. 4 is a schematic diagram of a second display panel according to the second embodiment of the present application. As illustrated in FIG. 4, the difference between this embodiment and the previous embodiment is that the material of the touch connection line 170 and the drilling process are different. Specifically, the part of the touch connection line 170 located in the first through hole 131 and the second through hole 132 is formed by the same material as the bottom electrode 121 or the top electrode 123, and the part located in the third through hole 133 and the fourth through hole 134 is formed by a composite material of carbon nanotubes and organic polymers.

In this solution, a possible photolithography drilling solution may be used. Specifically, after the manufacturing process of the pixel defining layer 130 is completed on substrate 110, the first through hole 131 is formed in pixel defining layer 130. The bottom electrode 121 of the light-emitting element 120 is formed between pixel defining layer 130. The material of the bottom electrode 121 is filled in first through hole 131 to serve as part of touch connection line 170. After the manufacturing process of the light-emitting layer 122 of the light-emitting element 120 is completed, when forming the top electrode 123, part of the top electrode 123 material is used to fill the first through hole 131. At this time, the top electrode 123 is in an electrically connected state with the touch connection line 170 in the first through hole 131. By a photolithography process, a second through hole 132 is formed in the top electrode 123, so that the top electrode 123 is disconnected from the touch connection line 170 in the first through hole 131. Subsequently, after the film manufacturing processes of the first inorganic layer 141 and the first organic layer 144 are completed, the third through hole 133 and the fourth through hole 134 are formed. The composite material of carbon nanotubes and organic polymers is filled in the third through hole 133 and the fourth through hole 134 to form the touch connection line 170.

In this embodiment, the touch electrode 151 formed of a composite material of carbon nanotubes and organic polymers is disposed between the first organic layer 144 and the second organic layer 145, and the touch connection line 170 is disposed using the first through hole 131, the second through hole 132, the third through hole 133, and the fourth through hole 134, so that the touch electrode 151 is connected to the touch driving layer 160 through the touch connection line 170. That is, a touch electrode layer 150 is formed in the encapsulation layer 140, and the touch driving layer 160 on the substrate 110 of the display panel 100 is used for driving. Through the drilling process, the touch connection line 170 is used to transmit the signal to realize the touch function. The solution of this embodiment can improve the touch accuracy without reducing the encapsulating strength.

Figure 5:
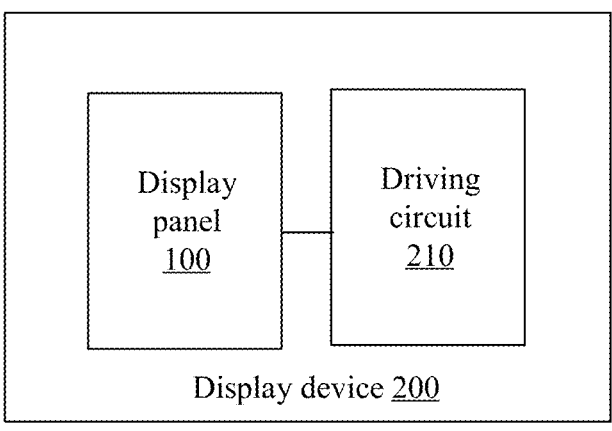
FIG. 5 is a schematic diagram of a display device according to the present application.

FIG. 5 is a schematic diagram of a display device according to the present application. As illustrated in FIG. 5, the present application further discloses a display device. The display device 200 includes a driving circuit 210 and a display panel 100 described in any of the above embodiments. The driving circuit 210 drives the display panel 100 to display.

In this application, by disposing the touch electrode layer 150 in the encapsulation layer 140, on the one hand, the insulation property and thickness of the encapsulation layer 140 are used to prevent the touch electrode layer 150 from affecting the light-emitting element 120, and at the same time reduce the interference of the cathode of the light-emitting element 120 on the touch signal. That is, the encapsulation layer 140 is used to insulate and block the touch electrode layer 150. On the other hand, by disposing the touch electrode layer 150 is disposed inside the encapsulation layer 140, without affecting the encapsulating effect of the encapsulation layer 140, the touch connection line 170 is used to penetrate the encapsulation layer 140 and the pixel defining layer 130, so that the touch driving layer 160 and the touch electrode layer 150 can be connected by the touch connection line 170. Thus, the driving wiring problem of the touch electrode layer 150 in the encapsulation layer 140 is solved by means of via holes, and so the impact on the encapsulation layer 140 is relatively small. Furthermore, it is realized that the touch driving layer 160 is disposed on the substrate 110, so that there is no need to set an external touch driving circuit for the touch electrode layer 150, thereby improving the touch accuracy without reducing the encapsulating strength, and improving the quality of the display panel 100.

It should be noted that the inventive concept of the present application can be formed into many embodiments, but the length of the application document is limited and so these embodiments cannot be enumerated one by one. Therefore, should no conflict be present, the various embodiments or technical features described above can be arbitrarily combined to form new embodiments. After the various embodiments or technical features are combined, the original technical effects may be enhanced.

The foregoing is a further detailed description of the present application with reference to some specific optional implementations, but it cannot be determined that the specific implementation of the present application is limited to these implementations. For those having ordinary skill in the technical field to which the present application pertains, several deductions or substitutions may be made without departing from the concept of the present application, and all these deductions or substitutions should be regarded as falling in the scope of protection of the present application.

What is claimed is:

1. A display panel, comprising:

a substrate;

a light-emitting element layer, arranged on the substrate and comprising a plurality of light-emitting elements arranged in an array;

a pixel defining layer, arranged on the substrate, wherein every two adjacent light-emitting elements are separated from each other by the pixel defining layer;

an encapsulation layer, arranged on the light-emitting element layer and used for encapsulating the light-emitting element layer; and a touch electrode layer, arranged in the encapsulation layer;

a touch driving layer, arranged between the substrate and the light-emitting element layer; and a plurality of touch connection lines, arranged to pass through the encapsulation layer and the pixel defining layer and used for connecting the touch electrode layer to the touch driving layer.

2. The display panel as recited in claim 1, wherein the touch electrode layer is formed of a composite material of a carbon nanotube and an organic polymer.

3. The display panel as recited in claim 1, wherein the encapsulation layer comprises a first inorganic layer, an organic encapsulation layer, and a second inorganic layer; wherein the first inorganic layer is arranged on the light-emitting element layer, wherein the organic encapsulation layer is arranged on the first inorganic layer, wherein the second inorganic layer is arranged on the organic encapsulation layer;

wherein the touch electrode layer is arranged between the first inorganic layer and the second inorganic layer.

4. The display panel as recited in claim 3, wherein the pixel defining layer comprises a first through hole, wherein the first inorganic layer comprises a third through hole corresponding to the first through hole; wherein the respective touch connection line is disposed to pass through the first through hole and the third through hole, and is used to connect the touch driving layer to the touch electrode layer.

5. The display panel as recited in claim 3, wherein the organic encapsulation layer comprises a first organic layer and a second organic layer, wherein the first organic layer is disposed on the first inorganic layer, wherein the second organic layer is disposed on the first organic layer;

wherein the touch electrode layer is disposed between the first organic layer and the second organic layer.

6. The display panel as recited in claim 5, wherein the first organic layer has a thickness that is less than a thickness of the second organic layer.

7. The display panel as recited in claim 6, wherein the first organic layer has a thickness that is less than or equal to 10 μm and greater than or equal to 3 μm; wherein the organic encapsulation layer has a thickness that is less than or equal to 30 μm and greater than or equal to 10 μm.

8. The display panel as recited in claim 5, wherein each of the plurality of light-emitting elements comprises a bottom electrode, a light-emitting layer, and a top electrode;

wherein the light-emitting layer is arranged between the bottom electrode and the top electrode, wherein the top electrodes of adjacent light-emitting elements are electrically connected to each other, wherein the first inorganic layer is arranged on the top electrode;

wherein there is defined a first through hole in the pixel defining layer, a second through hole in the top electrode corresponding to the first through hole, a third through hole in the first inorganic layer corresponding to the second through hole, and a fourth through hole in the first organic layer corresponding to the third through hole;

wherein the respective touch connection line is arranged to pass through the fourth through hole, the third through hole, the second through hole, and the first through hole, and is used to connect the touch driving layer to the touch electrode layer.

9. The display panel as recited in claim 8, wherein the third through hole has an aperture that is smaller than an aperture of the second through hole; wherein the first inorganic layer is filled in the second through hole, wherein the third through hole extends into the second through hole and is communicated to the first through hole; wherein the respective touch connection line and the corresponding top electrode are isolated from each other by the respective first inorganic layer.

10. The display panel as recited in claim 9, wherein a portion of the touch connection line located in the first through hole and the second through hole is formed of a material identical with that of the bottom electrode or the top electrode, and wherein a portion of the touch connection line located in the third through hole and the fourth through hole is formed of a composite material of a carbon nanotube and an organic polymer.

11. The display panel as recited in claim 1, wherein the touch electrode layer comprises a plurality of touch electrodes, each of which is disposed corresponding to a plurality of light-emitting elements; wherein each of the plurality of touch electrodes is connected to the touch driving layer through at least two of the touch connection lines.

12. The display panel as recited in claim 11, wherein the touch driving layer comprises a plurality of touch driving lines, wherein each touch electrode is connected to a plurality of touch connection lines, and wherein the plurality of touch connection lines are correspondingly connected to the same respective touch driving line.

13. The display panel as recited in claim 11, wherein the plurality of light-emitting elements comprise a plurality of red light-emitting elements, a plurality of green light-emitting elements, and a plurality of blue light-emitting elements; wherein every three adjacent red light-emitting element, green light-emitting element, and blue light-emitting element constitute a pixel; wherein each of the plurality of touch electrodes is disposed to cover at least three light-emitting elements.

14. A display device, comprising a display panel and a driving circuit configured to drive the display panel to display, the display panel comprising:

a substrate;

a light-emitting element layer, arranged on the substrate and comprising a plurality of light-emitting elements arranged in an array;

a pixel defining layer, arranged on the substrate, wherein every two adjacent light-emitting elements are separated from each other by the pixel defining layer;

an encapsulation layer, arranged on the light-emitting element layer and used for encapsulating the light-emitting element layer; and a touch electrode layer, arranged in the encapsulation layer;

a touch driving layer, arranged between the substrate and the light-emitting element layer; and a plurality of touch connection lines, arranged to pass through the encapsulation layer and the pixel defining layer and used for connecting the touch electrode layer to the touch driving layer.

15. The display device as recited in claim 14, wherein the touch electrode layer is formed of a composite material of a carbon nanotube and an organic polymer.

16. The display device as recited in claim 14, wherein the encapsulation layer comprises a first inorganic layer, an organic encapsulation layer, and a second inorganic layer; wherein the first inorganic layer is arranged on the light-emitting element layer, wherein the organic encapsulation layer is arranged on the first inorganic layer, and wherein the second inorganic layer is arranged on the organic encapsulation layer;

wherein the touch electrode layer is arranged between the first inorganic layer and the second inorganic layer.

17. The display device as recited in claim 16, wherein the pixel defining layer comprises a first through hole, wherein the first inorganic layer comprises a third through hole corresponding to the first through hole; wherein the respective touch connection line is arranged to pass through the first through hole and the third through hole, and is used to connect the touch driving layer to the touch electrode layer.

18. The display device as recited in claim 16, wherein the organic encapsulation layer comprises a first organic layer and a second organic layer, wherein the first organic layer is disposed on the first inorganic layer, wherein the second organic layer is disposed on the first organic layer;

wherein the touch electrode layer is disposed between the first organic layer and the second organic layer.

19. The display device as recited in claim 18, wherein the first organic layer has a thickness that is less than a thickness of the second organic layer.

20. The display device as recited in claim 19, wherein the first organic layer has a thickness that is less than or equal to 10 μm and greater than or equal to 3 μm; wherein the organic encapsulation layer has a thickness that is less than or equal to 30 μm and greater than or equal to 10 μm.

\* \* \* \* \*